United States Patent
Prather et al.

(10) Patent No.: US 11,294,836 B2
(45) Date of Patent: *Apr. 5, 2022

(54) METHODS FOR PERFORMING MULTIPLE MEMORY OPERATIONS IN RESPONSE TO A SINGLE COMMAND AND MEMORY DEVICES AND SYSTEMS EMPLOYING THE SAME

(71) Applicant: Micron Technology, Inc., Boise, ID (US)

(72) Inventors: Matthew A. Prather, Boise, ID (US); Frank F. Ross, Boise, ID (US); Randall J. Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/074,281

(22) Filed: Oct. 19, 2020

(65) Prior Publication Data

US 2021/0034554 A1 Feb. 4, 2021

Related U.S. Application Data

(63) Continuation of application No. 16/543,482, filed on Aug. 16, 2019, now Pat. No. 10,810,145, which is a (Continued)

(51) Int. Cl.
*G06F 13/00* (2006.01)
*G06F 13/16* (2006.01)
(Continued)

(52) U.S. Cl.
CPC ........ *G06F 13/1689* (2013.01); *G06F 3/0604* (2013.01); *G06F 3/0625* (2013.01);
(Continued)

(58) Field of Classification Search
CPC ... G11C 11/406; G11C 7/22; G11C 11/40611; G11C 11/4096; G11C 7/1045;
(Continued)

(56) References Cited

U.S. PATENT DOCUMENTS 8,988,101 B2  3/2015  Song et al.
9,082,504 B2  7/2015  Kim et al.
(Continued)

FOREIGN PATENT DOCUMENTS

KR  20180063230 A  6/2018

OTHER PUBLICATIONS

International Application No. PCT/US2018/047001—International Search Report and Written Opinion, dated Feb. 22, 2019, 14 pages.
(Continued)

*Primary Examiner* — Thong Q Le
(74) *Attorney, Agent, or Firm* — Perkins Coie LLP (57) ABSTRACT

Memory devices, memory systems, and methods of operating memory devices and systems are disclosed in which a single command can trigger a memory device to perform multiple operations, such as a single refresh command that triggers the memory device to both perform a refresh command and to perform a mode register read. One such memory device comprises a memory, a mode register, and circuitry configured, in response to receiving a command to perform a refresh operation at the memory, to perform the refresh operation at the memory, and to perform a read of the mode register. The memory can be a first memory portion, the memory device can comprise a second memory portion, and the circuitry can be further configured, in response to the command, to provide on-die termination at the second memory portion of the memory system during at least a portion of the read of the mode register.

20 Claims, 4 Drawing Sheets

Related U.S. Application Data continuation of application No. 16/030,740, filed on Jul. 9, 2018, now Pat. No. 10,552,087, application No. 17/074,281, which is a continuation of application No. 16/432,413, filed on Jun. 5, 2019, now Pat. No. 10,846,248, which is a continuation of application No. 16/030,746, filed on Jul. 9, 2018, now Pat. No. 10,489,316.

(60) Provisional application No. 62/680,422, filed on Jun. 4, 2018.

(51) Int. Cl.
| | |
|---|---|
| *G11C 11/406* | (2006.01) |
| *G11C 7/22* | (2006.01) |
| *G06F 3/06* | (2006.01) |
| *G06F 13/40* | (2006.01) |

(52) U.S. Cl.
CPC .......... *G06F 3/0659* (2013.01); *G06F 3/0673* (2013.01); *G06F 13/4086* (2013.01); *G11C 7/22* (2013.01); *G11C 11/406* (2013.01)

(58) Field of Classification Search
CPC . G11C 11/40603; G06F 3/0659; H01L 24/29; H01L 21/56; H01L 21/67103; H01L 21/6833; H01L 21/6835; H01L 2221/68322; H01L 2221/68368; H01L 2221/68381; H01L 2224/27002; H01L 2224/2732; H01L 2224/27334
USPC ....................................................... 365/222
See application file for complete search history.

(56) References Cited

U.S. PATENT DOCUMENTS

| | | |
|---|---|---|
| 9,224,451 B2 | 12/2015 | Fujisawa |
| 10,141,935 B2 | 11/2018 | Bains et al. |
| 10,249,351 B2 | 4/2019 | Kang et al. |
| 10,489,316 B1 | 11/2019 | Prather et al. |
| 10,552,087 B2 | 2/2020 | Prather et al. |
| 10,846,248 B2 * | 11/2020 | Prather ................. G06F 3/0604 |
| 2006/0239095 A1 | 10/2006 | Shi et al. |
| 2007/0028146 A1 | 2/2007 | Ruckerbauer |
| 2007/0109013 A1 | 5/2007 | Lee et al. |
| 2014/0258786 A1 | 9/2014 | Resnick |
| 2016/0148654 A1 | 5/2016 | Sohn et al. |
| 2017/0098470 A1 | 4/2017 | Jose et al. |
| 2017/0110177 A1 | 4/2017 | Lee et al. |
| 2017/0110178 A1 | 4/2017 | Bains |
| 2017/0221546 A1 | 8/2017 | Loh et al. |
| 2018/0061474 A1 | 3/2018 | Choi |
| 2018/0101204 A1 | 4/2018 | Fackenthal |
| 2018/0197599 A1 | 7/2018 | Choi et al. |
| 2019/0369915 A1 | 12/2019 | Prather et al. |
| 2019/0369923 A1 | 12/2019 | Prather et al. |
| 2019/0370195 A1 | 12/2019 | Prather et al. |

OTHER PUBLICATIONS

KR Patent Application No. 10-2020-7037966—Korean Office Action and Search Report, dated Oct. 29, 2021, with English Translation, 13 pages.
EP Patent Application No. 18921731.8—Partial Supplementary European Search Report, dated Feb. 3, 2022, 15 pages.

\* cited by examiner

METHODS FOR PERFORMING MULTIPLE MEMORY OPERATIONS IN RESPONSE TO A SINGLE COMMAND AND MEMORY DEVICES AND SYSTEMS EMPLOYING THE SAME

CROSS-REFERENCE TO RELATED APPLICATIONS

This application is a continuation of U.S. application Ser. No. 16/543,482, filed Aug. 16, 2019; which is a continuation of U.S. application Ser. No. 16/030,740, filed Jul. 9, 2018, now U.S. Pat. No. 10,552,087; which claims the benefit of U.S. Provisional Application No. 62/680,422, filed Jun. 4, 2018; each of which is incorporated herein by reference in its entirety.

This application is also continuation of U.S. application Ser. No. 16/432,413, filed Jun. 5, 2019; which is a continuation of U.S. application Ser. No. 16/030,746, filed Jul. 9, 2018, now U.S. Pat. No. 10,489,316; which claims the benefit of U.S. Provisional Application No. 62/680,422, filed Jun. 4, 2018; each of which is incorporated herein by reference in its entirety.

TECHNICAL FIELD

The present disclosure generally relates to memory devices and systems, and more particularly to methods for performing multiple memory operations in response to a single command memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Many memory devices, such as double data rate (DDR) DRAM devices, are capable of operating in a variety of modes (e.g., at different clock speeds, with different refresh rates, etc.). In many cases, various operating parameters of the memory device (e.g., voltage, temperature, device age, etc.) may be utilized to determine an appropriate mode. In some memory devices, a connected host may periodically poll one or more of these operating parameters of a memory device to determine whether to adjust the mode. For example, a connected host may poll the device temperature (e.g., or information corresponding to the device temperature) to determine whether to modify the refresh rate of the device. The polling of the device temperature may require a dedicated command on the command/address bus of the memory device, and the polling may be frequent enough to adversely impact (e.g., via congestion) the command/address bus.

Accordingly, several embodiments of the present technology are directed to memory devices, systems including memory devices, and methods of operating memory devices in which a single command on the command/address bus can trigger a memory device to perform more than one operation, such as a single refresh command that triggers the memory device to both perform a refresh command and to perform a mode register read (e.g., and to output information therefrom to the host device). In one embodiment, a memory device comprises a memory, a mode register, and circuitry configured, in response to receiving a command to perform a refresh operation at the memory, to perform the refresh operation at the memory, and to perform a read of the mode register. In some embodiments, the memory can be a first memory portion, the memory device can comprise a second memory portion, and the circuitry can be further configured, in response to the command, to provide on-die termination at the second memory portion of the memory system during at least a portion of the read of the mode register.

Figure 1:
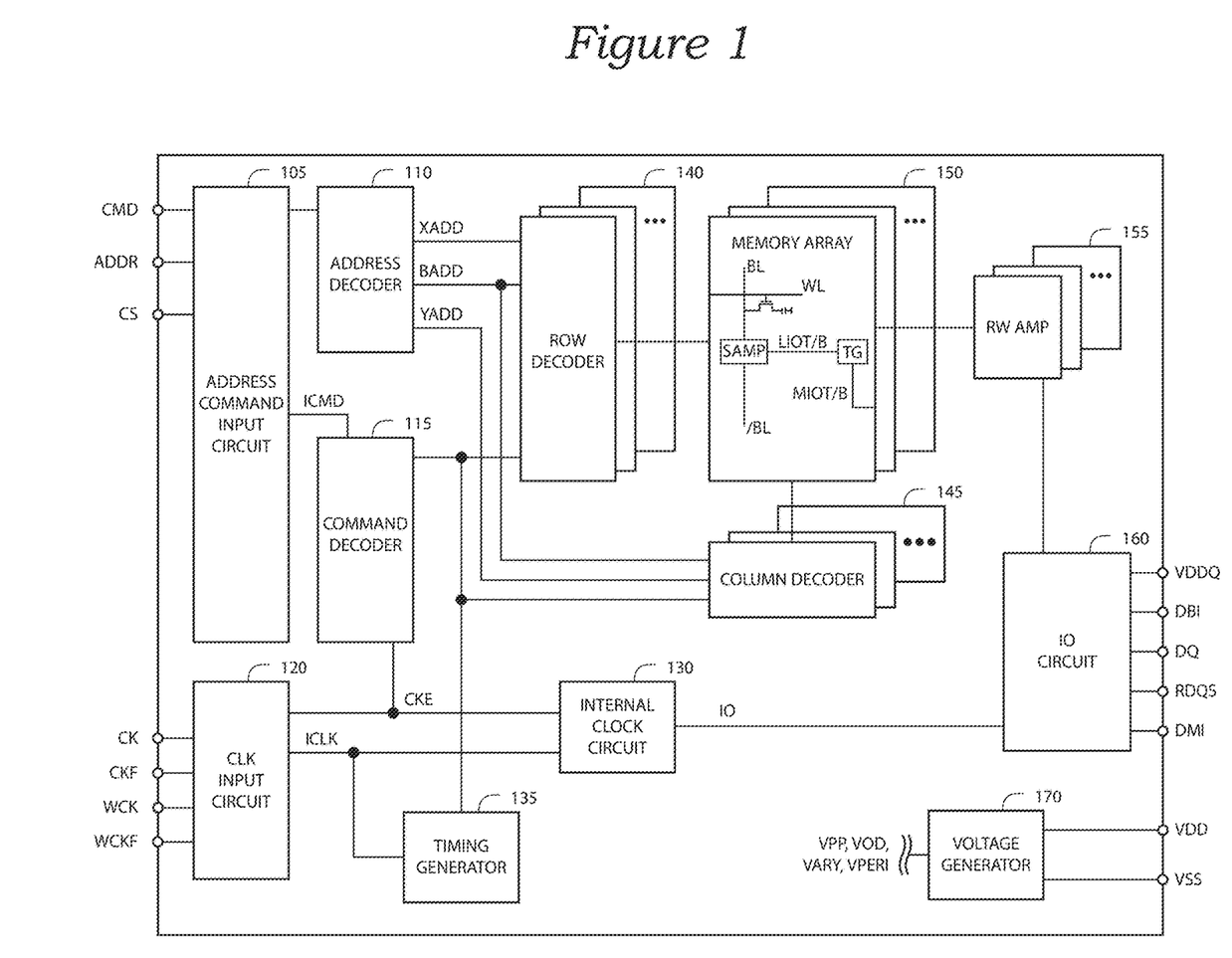
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The 10 clock signals can be supplied to the input/output circuit 160 and can be used as a timing signal for determining an output timing of read data and the input timing of write data. The 10 clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be capable of operating in a variety of modes (e.g., at different clock speeds, with different refresh rates, etc.). In many cases, various operating parameters of the memory device 100 (e.g., voltage, temperature, device age, etc.) may be stored in a mode register thereof and utilized (e.g., by a connected host device) to determine an appropriate mode. For example, a connected host may periodically poll one or more of these operating parameters of the memory device 100 to determine whether to adjust the mode (e.g., increasing the refresh rate due to an elevated device temperature, or reducing the refresh rate due to a reduced device temperature).

Figure 2:
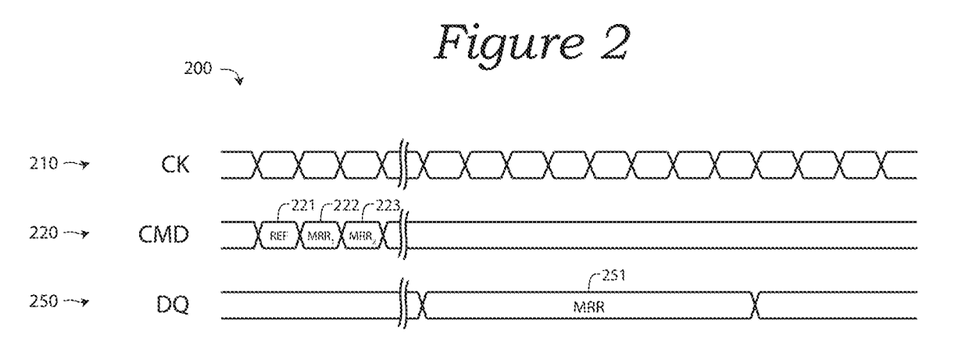
FIGS. 2 and 3 are simplified timing diagrams schematically illustrating the operation of memory devices and systems.

One approach to polling operating parameters of a memory device includes a host sending a dedicated command to the memory device to perform a mode register read operation and to output values therefrom on the data bus of the memory device. For example, as can be seen with reference to the simplified timing diagram 200 illustrated in FIG. 2, in response to a host device providing, on a command/address bus 220, a mode register read command (comprising first a first $MRR_1$ portion 222 and a second $MRR_2$ portion 223), the memory device outputs (e.g., after a predetermined delay) mode register read (MRR) data 251 to the host device over a data bus 250 thereof. As can be seen with reference to FIG. 2, the mode register read command follows shortly (e.g., immediately) after a refresh command 221, as is a common practice for polling memory devices for operating parameters that may impact the desired refresh rate thereof. As can be further seen with reference to FIG. 2, the mode register read command consumes two cycles of the device clock 210 on the command/address bus.

Figure 3:
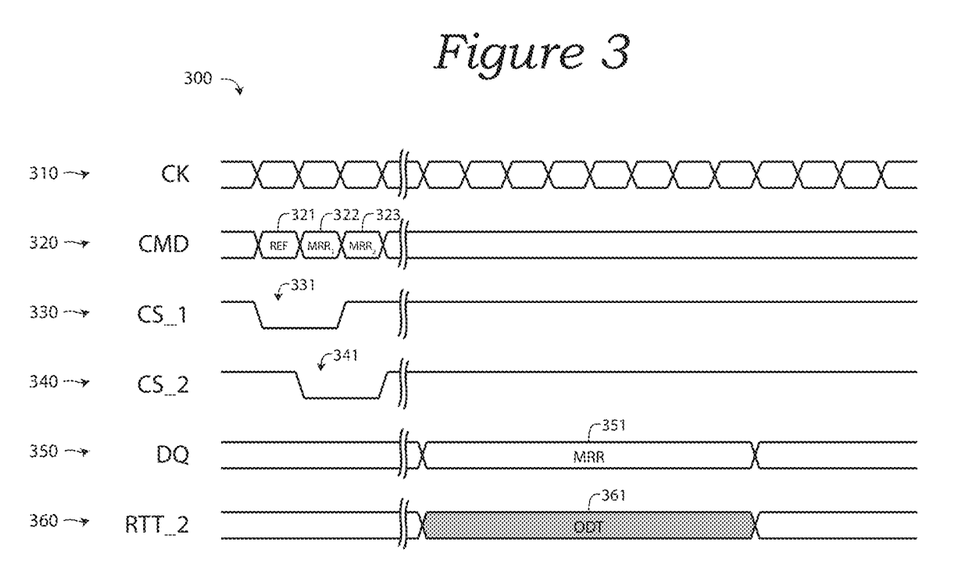

FIG. 3 is likewise a simplified timing diagram schematically 300 illustrating the operation of a memory system with multiple memory portions (e.g., channels, dies, ranks, banks, etc.). As can be seen with reference FIG. 3, in response to a host device providing, on a command/address bus 320, a mode register read command (comprising first a first $MRR_1$ portion 322 and a second $MRR_2$ portion 323) to a first memory portion (e.g., as indicated by asserting a low chip-select signal 331 on a first chip select terminal 330 during the first clock cycle of the mode register read command), the first memory portion outputs (e.g., after a predetermined delay) MRR data 351 to the host device over a data bus 350 of the memory device. The mode register read command can follow shortly (e.g., immediately) after a refresh command 321 directed to the same memory portion (as is indicated by the assertion of a low chip-select signal 331 on the first chip select terminal 330 during the refresh command 321), as is a common practice for polling memory devices for operating parameters that may impact the desired refresh rate thereof. To prevent degradation of the MRR data 351 over the shared data bus, the second memory portion 360 can be instructed (e.g., by asserting low chip-select signal 341 on a second chip select terminal 340 during both clock cycles of the mode register read command) to provide on-die termination (ODT) 361 during the transmission of the MRR data 351. As can be further seen with reference to FIG. 3, the mode register read command consumes two cycles of the device clock 310 on the command/address bus.

In view of the frequency with which the operating parameters of the memory device stored in a mode register may be polled by a connected host device (e.g., in some cases as frequently as refresh commands are sent), the consumption of command/address bus bandwidth by mode register read commands may rise to disadvantageous levels. Accordingly, embodiments of the present technology may solve the foregoing problems by providing a way for a connected host device to poll operating parameters of a memory device without providing a dedicate mode register read command, thereby reducing the consumption of command/address bus bandwidth.

Figure 4:
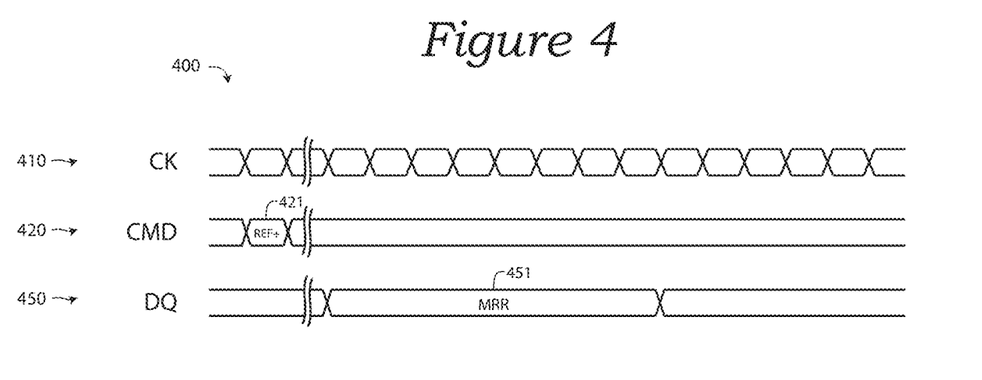
FIGS. 4 through 6 are simplified timing diagrams schematically illustrating the operation of memory devices and systems in accordance with embodiments of the present technology.

Turning to FIG. 4, a simplified timing diagram 400 schematically illustrates the operation of a memory device in accordance with an embodiment of the present technology. As can be seen with reference to FIG. 4, in response to a host device providing, on a command/address bus 420, a refresh command 421, in addition to performing the commanded refresh operation (not illustrated), the memory device outputs (e.g., after a predetermined delay) mode register read (MRR) data 451 to the host device over a data bus 450 thereof. By configuring the memory device to perform, in addition to a refresh operation, a mode register read operation in response to a refresh command, the amount of command/address bus bandwidth consumed can be greatly reduced (e.g., utilizing one cycle worth of clock 410 to send a single command triggering the same operations that previously took three cycles worth of clock 410 to trigger).

In accordance with one aspect of the disclosure, the refresh command 421 can be a standard refresh command, without any additional information indicating the additional mode register read operation to be performed, as in an embodiment in which the memory device is configured (e.g., via a mode register setting or other configuration mechanism) to interpret all received refresh commands as though they were refresh commands accompanied by mode register read commands. Alternatively, the refresh command 421 can be a modified refresh command in which one or more bit flags are provided to indicate to the memory device that the mode register read operation is to be performed.

Figure 5:
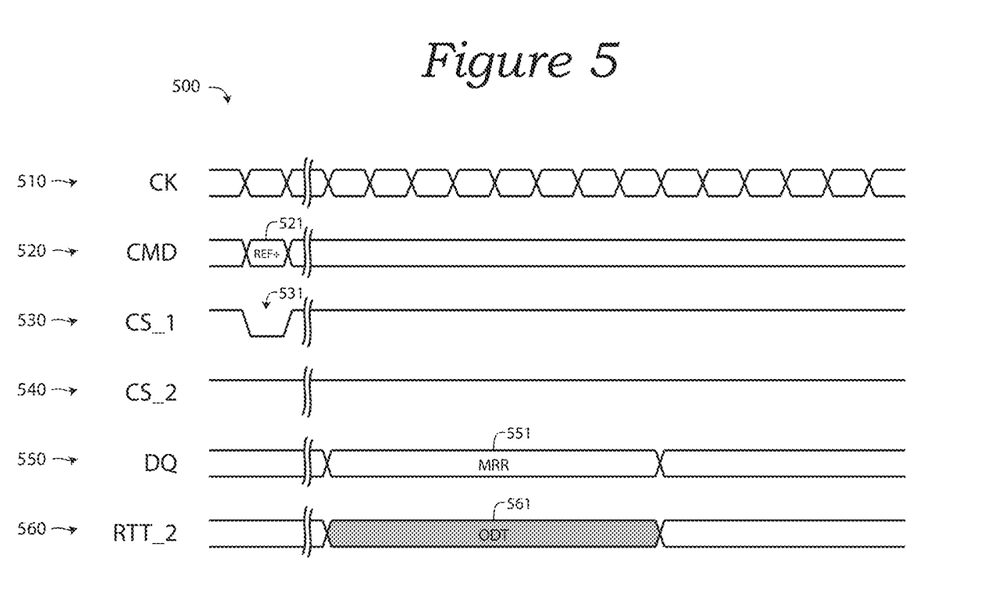

Turning to FIG. 5, a simplified timing diagram 500 schematically illustrates the operation of a memory system including multiple memory portions (e.g., dies, devices, channels, ranks, banks, etc.) in accordance with an embodiment of the present technology. As can be seen with reference to FIG. 5, in a memory device or system with two or more separately-addressable portions (e.g., two channels of a memory device, two memory devices of a memory system), a common command/address bus 520 can be used to indicate to the portions that a refresh operation and a mode register read is to be performed by one of the portions (e.g., via a refresh command 521). Unlike the approach illustrated in FIG. 3, however, in the approach illustrated in FIG. 5, in response to an indication to a memory portion that it is not the target of the refresh/mode register read command, the memory portion enters an on-die termination mode for the duration of the communication of the mode register contents on the common data bus.

In the example of FIG. 5, a refresh command 521 is sent with a corresponding indication 531 on the first chip select terminal 530 that the target of the refresh command corresponds to the first portion of the memory device (e.g., by pulsing the first chip select terminal 530 low for one cycle of a clock 510 to indicate the targeted portion, and by leaving the second chip select terminal 540 corresponding to the non-targeted portion high to indicate that it is not the targeted portion). In response, the first portion of the memory device both performs the refresh operation (not illustrated), and also outputs (e.g., after a predetermined delay) MRR data 551 to the host device over a data bus 550 thereof. Moreover, in response to the same refresh command 521, the second portion 560 of the memory device enters an on-die termination mode 561 for the duration of a communication 551 of the first channel 550.

In accordance with one aspect of the disclosure, the refresh command 521 can be a standard refresh command, without any additional information indicating the additional mode register read operation to be performed, as in an embodiment in which the memory device is configured (e.g., via a mode register setting or other configuration mechanism) to interpret all received refresh commands as though they were refresh commands accompanied by mode register read commands. Alternatively, the refresh command 521 can be a modified refresh command in which one or more bit flags are provided to indicate to the memory device that the mode register read operation is to be performed. The refresh command 521 may further include one or more bit flags indicating to the memory device that on-die termination is to be performed by non-targeted portions of the memory device during output of mode register read data.

As the approach illustrated in FIG. 5, in which a refresh command conveys information to memory portions that are not targeted for a refresh operation (as indicated by corresponding chip select signals) may involve non-targeted portions of the memory device decoding commands, this approach can involve additional power consumption that, for certain power-sensitive memory environments (e.g., mobile), may not be desirable. Accordingly, FIG. 6 illustrates with a simplified timing diagram 600 the operation of a memory system including multiple memory portions (e.g., dies, devices, channels, ranks, banks, etc.) in accordance with an embodiment of the present technology in which the decoding of commands by non-targeted memory portions can be avoided.

Figure 6:
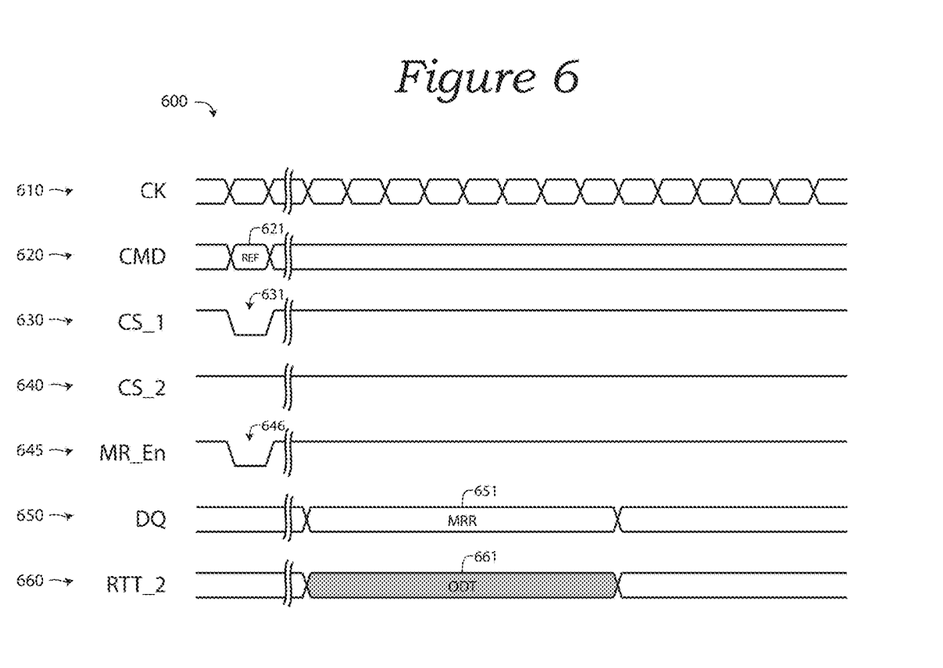

As can be seen with reference to FIG. 6, in a memory device or system with two or more separately-addressable portions (e.g., two channels of a memory device, two memory devices of a memory system), a common command/address bus 620 can be used to indicate to the portions that a refresh operation and a mode register read is to be performed by one of the portions (e.g., via a refresh command 621). Unlike the approach illustrated in FIG. 5, however, in the approach illustrated in FIG. 6, a refresh command 621 is sent with not only a corresponding indication 631 on the first chip select terminal 630 that the target of the refresh command corresponds to the first portion of the memory device (e.g., by pulsing the first chip select terminal 630 low for one cycle of a clock 610 to indicate the targeted portion, and by leaving the second chip select terminal 640 corresponding to the non-targeted portion high to indicate that it is not the targeted portion), but also with an indication 646 on a dedicated "mode register read enabled" terminal 645 that the refresh command 621 should be decoded even by non-targeted memory portions (e.g., to enable the non-targeted portions to provide on-die termination). In response, the first portion of the memory device both performs the refresh operation (not illustrated), and also outputs (e.g., after a predetermined delay) MRR data 651 to the host device over a data bus 650 thereof. Moreover, in response to the same refresh command 621, which the second portion of the memory device is configured to decode in response to the indication 646 on the mode register read enabled terminal 645, the second portion 660 of the memory device enters an on-die termination mode 661 for the duration of a communication 651 of the first channel 650.

This arrangement, in which commands are only decoded by non-targeted portions when an enable signal is asserted, permits non-targeted portions of a memory device to avoid having to decode other commands (read commands, write commands, etc.), but still allows for the proper on-die termination during a mode register read output, providing a desirable power savings, albeit at the cost of dedicating a terminal to the enable signal. In some embodiments, however, the enable signal may be provided on a shared terminal also dedicated to other functions, such as loopback DQ (LBDQ) and/or loopback DQS (LBDQS) terminals.

Although in the foregoing examples, memory devices have been illustrated and described as responding to refresh commands with both refresh operations and mode register read operations, in other embodiments of the present technology other commands can be configured to trigger other combinations of operations to provide similar savings in command/address bus bandwidth. Moreover, although the memory devices in the foregoing examples have been described and illustrated as responding to every refresh command with both a refresh operation and a mode register read operation, in other embodiments of the present technology the response of a memory device to such a command can be configured (e.g., with mode register settings, applied enable signals, etc. indicating whether or not the multiple operation in response to a single command mode is enabled).

Figure 7:
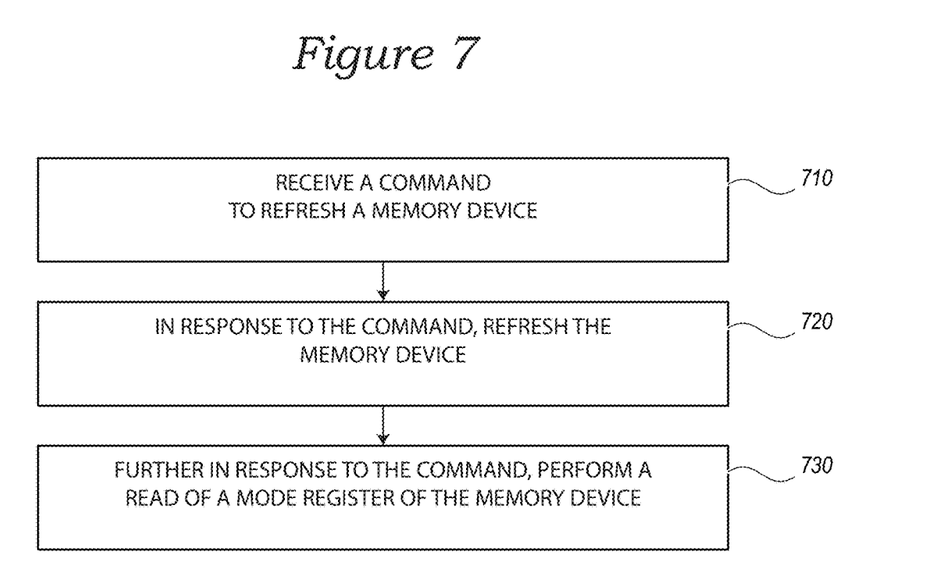
FIG. 7 is a flow chart illustrating a method of operating a memory system in accordance with an embodiment of the present technology.

FIG. 7 is a flow chart illustrating a method of operating a memory device in accordance with an embodiment of the present technology. The method includes receiving a command to refresh a memory device (box 710). According to one aspect of the present disclosure, the receiving features of box 710 may be implemented with command/address input circuit 105, terminals connected thereto, and/or command decoder 115, as illustrated in FIG. 1 in greater detail, above. The method further includes, in response to the command, refreshing the memory device (box 720), and performing a read of a mode register of the memory device (box 730). According to one aspect of the present disclosure, the refreshing features and mode register reading features of boxes 720 and 730 may be implemented with memory array 150, read/write amplifiers 155, input/output circuit 160, terminals connected thereto, and/or other circuit elements of memory device 100, as illustrated in FIG. 1 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. A memory device, comprising:
   a first memory portion;
   a second memory portion;
   a mode register;
   an external terminal; and
   circuitry configured, in response to receiving a command to perform a refresh operation at the first memory portion and an indication at the external terminal indicating that a mode register read function is enabled, to:
   perform the refresh operation at the first memory portion,
   perform a read of the mode register, and
   provide on-die termination at the second memory portion during at least a portion of the read of the mode register.

2. The memory device of claim 1, wherein the circuitry is further configured to decode the command at the second memory portion in response to the indication indicating that the mode register read function is enabled.

3. The memory device of claim 1, wherein the circuitry is further configured to decode the command at the first portion in response to an indication received at a first external terminal that the refresh operation is directed to the first memory portion.

4. The memory device of claim 3, wherein the first external terminal is a first chip select terminal.

5. The memory device of claim 4, further comprising a second chip select terminal corresponding to the second memory portion.

6. The memory device of claim 1, wherein the read of the mode register includes outputting data from the mode register from the memory device.

7. The memory device of claim 6, wherein the outputted data includes information corresponding to a temperature of the first memory portion or a refresh rate of the first memory portion.

8. The memory device of claim 1, wherein the command has a duration on a command/address bus of the memory device of a single clock cycle of the memory device.

9. The memory device of claim 1, wherein the external terminal is dedicated only receiving indications corresponding to the mode register read function.

10. The memory device of claim 1, wherein the external terminal is a shared terminal configured to perform loopback functions.

11. A method of operating a memory system, comprising:
    receiving a command instructing a first portion of the memory system to perform a refresh operation and an indication at an external terminal indicating that a mode register read function is enabled; and
    in response to the command and the indication:
    performing the refresh operation at the first portion of the memory system,
    performing a read of a mode register of the memory system, and
    providing on-die termination at a second portion of the memory system during at least a portion of the read of the mode register.

12. The method of claim 11, further comprising decoding the command at the second memory portion in response to the indication indicating that the mode register read function is enabled.

13. The method of claim 11, further comprising decoding the command at the first portion in response to an indication received at a first external terminal that the refresh operation is directed to the first memory portion.

14. The method of claim 13, wherein the first external terminal is a first chip select terminal.

15. The method of claim 11, wherein performing the read of the mode register includes outputting data from the mode register from the memory device.

16. The method of claim 15, wherein the outputted data includes information corresponding to a temperature of the first memory portion or a refresh rate of the first memory portion.

17. The method of claim 11, wherein the command has a duration on a command/address bus of the memory device of a single clock cycle of the memory device.

18. A memory device, comprising:
    a first memory portion;
    a second memory portion;
    a mode register;
    a first chip select terminal corresponding to the first memory portion;
    a second chip select terminal corresponding to the second memory portion;
    a mode register read function terminal; and circuitry configured, in response to receiving (i) a command to perform a refresh operation, (ii) a chip select signal at the first chip select terminal indicating that the refresh operation is directed to the first memory portion, (iii) no chip select signal at the second chip select terminal indicating that the refresh operation is not directed to the second memory portion and (iv) an indication at the mode register read function terminal indicating that a mode register read function of the memory device is enabled, to:

decode the command at the second memory portion.

19. The memory device of claim 18, wherein the circuitry is further configured to perform the refresh operation at the first memory portion, perform a read of the mode register, and provide on-die termination at the second memory portion during at least a portion of the read of the mode register.

20. The memory device of claim 18, wherein the command has a duration on a command/address bus of the memory device of a single clock cycle of the memory device.

\* \* \* \* \*